US012126280B2

United States Patent
Qian et al.

(10) Patent No.: US 12,126,280 B2
(45) Date of Patent: Oct. 22, 2024

(54) DUAL-ROTOR MICROFLUIDIC ENERGY CAPTURING AND POWER GENERATING DEVICE BASED ON PIEZOELECTRIC EFFECT

(71) Applicant: ZHEJIANG UNIVERSITY, Zhejiang (CN)

(72) Inventors: Peng Qian, Zhejiang (CN); Bo Feng, Zhejiang (CN); Dahai Zhang, Zhejiang (CN); Yulin Si, Zhejiang (CN); Xiaodong Liu, Zhejiang (CN)

(73) Assignee: ZHEJIANG UNIVERSITY, Zhejiang (CN)

( * ) Notice: Subject to any disclaimer, the term of this patent is extended or adjusted under 35 U.S.C. 154(b) by 0 days.

(21) Appl. No.: 18/556,358

(22) PCT Filed: Oct. 18, 2021

(86) PCT No.: PCT/CN2021/124503
§ 371 (c)(1),
(2) Date: Oct. 20, 2023

(87) PCT Pub. No.: WO2023/005003
PCT Pub. Date: Feb. 2, 2023

(65) Prior Publication Data
US 2024/0178767 A1 May 30, 2024

(30) Foreign Application Priority Data
Jul. 30, 2021 (CN) .......................... 202110870451.0

(51) Int. Cl.
*H02N 2/18* (2006.01)
*F03B 17/06* (2006.01)
*H10N 35/00* (2023.01)

(52) U.S. Cl.
CPC ............. *H02N 2/185* (2013.01); *F03B 17/06* (2013.01); *H10N 35/101* (2023.02); *F05B 2220/709* (2013.01); *F05B 2240/37* (2020.08)

(58) Field of Classification Search
CPC ...... H02N 2/185; H10N 35/101; F03B 17/06; F05B 2220/709; F05B 2240/37
See application file for complete search history.

(56) References Cited

U.S. PATENT DOCUMENTS

| 7,696,673 B1 * | 4/2010 | Yavid ...................... F42C 11/02 |
| | | 310/329 |
| 11,804,790 B2 * | 10/2023 | Magnusson .............. H02N 2/18 |

(Continued)

FOREIGN PATENT DOCUMENTS

| CN | 104993739 | 10/2015 |
| CN | 107086653 | 8/2017 |

(Continued)

OTHER PUBLICATIONS

"International Search Report (Form PCT/ISA/210) of PCT/CN2021/124503", mailed on Apr. 1, 2022, with English translation thereof, pp. 1-4.

(Continued)

*Primary Examiner* — Emily P Pham
(74) *Attorney, Agent, or Firm* — JCIPRNET

(57) ABSTRACT

Disclosed in the present invention is a dual-rotor microfluidic energy capturing and power generating device based on a piezoelectric effect. An inner ring of blades and an outer ring of blades are coaxially and movably sleeved, and rotate relatively. Sheet-like magnetic piezoelectric components and steel magnets are provided in an annular gap between the inner ring of blades and the outer ring of blades. Magnetic piezoelectric components are connected to an inner peripheral surface of the outer ring of blades, the magnetic piezoelectric components are magnetically repul- (Continued)

sive to the steel magnets, and the outer sides of the magnetic piezoelectric components are axially arranged. The inner ring of blades and the outer ring of blades rotate relatively to drive the magnetic piezoelectric components and the steel magnets to rotate relatively, and further drive the magnetic piezoelectric components to oscillate to generate mechanical energy which is then converted into electric energy.

10 Claims, 2 Drawing Sheets

(56) References Cited

U.S. PATENT DOCUMENTS

| | | | |
|---|---|---|---|
| 2013/0195655 A1* | 8/2013 | Kerner | .................... F03B 3/123 |
| | | | 416/212 A |
| 2016/0319666 A1* | 11/2016 | Blumer | ................. B23P 15/006 |
| 2017/0194836 A1 | 7/2017 | Miyake et al. | |

FOREIGN PATENT DOCUMENTS

| | | | | |
|---|---|---|---|---|
| CN | 112302849 | | 2/2021 | |
| CN | 112737411 A | * | 4/2021 | .............. F03B 13/14 |
| CN | 112796919 | | 5/2021 | |

OTHER PUBLICATIONS

"Written Opinion of the International Searching Authority (Form PCT/ISA/237) of PCT/CN2021/124503", mailed on Apr. 1, 2022, with English translation thereof, pp. 1-7.

* cited by examiner

DUAL-ROTOR MICROFLUIDIC ENERGY CAPTURING AND POWER GENERATING DEVICE BASED ON PIEZOELECTRIC EFFECT

CROSS-REFERENCE TO RELATED APPLICATION

This application is a 371 of international application of PCT application serial no. PCT/CN2021/124503, filed on Oct. 18, 2021, which claims the priority benefit of China application no. 202110870451.0, filed on Jul. 30, 2021. The entirety of each of the above-mentioned patent applications is hereby incorporated by reference herein and made a part of this specification.

BACKGROUND

Technical Field

The disclosure relates to a microfluidic energy generating device, in particular to a dual-rotor microfluidic energy capturing and power generating device based on piezoelectric effect.

Description of Related Art

Ocean observation is the basis for research, development and utilization of the ocean, and it is also a necessary basic measure for developing the economy, exploiting marine resources, and carrying out marine risk avoidance and disaster relief. With the advent and development of the "Information Age", acquiring, disseminating and utilizing marine information has become the prerequisite for all marine activities.

However, currently, one of the main bottlenecks that restricts the establishment of a comprehensive ocean observation system in China, especially for deep-sea observation systems, is the lack of effective energy supply. Ocean observation equipment includes, for example, sea buoys, autonomous unmanned submersibles, underwater gliders, seabed observation network, etc., and the energy supply of the above ocean observation equipment is mainly supplied by lithium batteries, etc. However, there is a certain restrictive relationship between the number of batteries carried and the power consumption of the instrument. The high operation costs limit the large-scale deployment of China's deep-sea observation equipment. In order to prolong the operation time of underwater observation equipment, some studies have proposed various technical solutions including nuclear battery and underwater wireless energy transmission technology. However, these solutions are still immature and distant from practical application. In recent years, ocean energy technology represented by marine current energy and wave energy has matured day by day, and a brand-new design scheme has been proposed to solve the in-situ energy supply of this type of ocean equipment, that is, to power underwater equipment through marine current energy capturing.

SUMMARY

In order to solve the problem of poor practicability of low-velocity microfluidic based on conventional tidal current energy utilization devices in the related art, the present disclosure combines the piezoelectric power generating characteristics of new piezoelectric materials and designs a dual-rotor microfluidic energy capturing device based on piezoelectric effect. The device is a dual-rotor energy-capturing structure, which may effectively extract low-velocity microfluidic energy. The present disclosure uses a piezoelectric structure to capture microfluidic energy under the impact of microfluidics, reducing the minimum power-generating flow velocity, and the dual-rotor structure design may effectively increase the oscillation frequency of the piezoelectric sheets under the action of microfluidic, and improve the power generating efficiency of the device.

The technical solution of the present disclosure is:

The disclosure includes an outer ring of blades, an inner ring of blades, a magnetic piezoelectric component and a magnetic steel. The inner ring of blades is movably sleeved in the middle of the outer ring of blades, and the inner ring of blades and the outer ring of blades are coaxially arranged and rotate relative to each other. There is an annular gap between the inner ring of blades and the outer ring of blades, and a plurality of magnetic piezoelectric components that are sheet-like and a plurality of magnetic steels are arranged in the annular gap. The plurality of magnetic piezoelectric components are arranged at intervals along the circumferential direction of the annular gap, the sheet-like outer sides of the plurality of magnetic piezoelectric components are fixedly connected to the inner peripheral surface of the outer ring of blades in the form of cantilever beams, and the plurality of magnetic steels are evenly spaced along the circumferential direction of the inner ring of blades and fixed on the outer peripheral surface of the inner ring of blades. The magnetic piezoelectric component and the magnetic steel are magnetically repulsively, and the straight line where the sheet-like outer side of the magnetic piezoelectric component is located is arranged along the axial direction of the inner ring of blades and the outer ring of blades. When the inner ring of blades and the outer ring of blades rotate relative to each other, the magnetic piezoelectric component and the magnetic steel are respectively driven to rotate relative to each other. The change in the movement of the magnetic steel relative to the magnetic piezoelectric component drives the oscillation of the inner end of the magnetic piezoelectric component to generate mechanical energy, which is then converted into electrical energy by the piezoelectric effect.

The magnetic piezoelectric component includes a piezoelectric sheet, a magnetic steel mass block and a piezoelectric substrate. The piezoelectric sheet is arranged on the piezoelectric substrate, and one side of the piezoelectric substrate is fixed on the inner peripheral surface of the outer ring of blades, and the other side of the piezoelectric substrate is fixed with a magnetic steel mass block. The length direction of the magnetic steel mass block is parallel to the other side of the piezoelectric substrate; the magnetic steel mass block is used for magnetic repulsion against the magnetic steel fixed on the inner ring of blades.

A plurality of bar-shaped grooves is arranged at intervals along the circumferential direction on the outer peripheral surface of the inner ring of blades, and each of the bar-shaped grooves is arranged along the axial direction of the inner ring of blades, and the magnetic steel is arranged in each of the bar-shaped grooves.

The magnetic steel is a bar block arranged along the axial direction of the inner ring of blades.

There is a gap between the magnetic steel mass block and the magnetic steel, and there is no contact between them.

One side of the magnetic steel mass block adjacent to an inner ring rotor is an N pole, another side of the magnetic steel mass block adjacent to the outer ring rotor is an S pole;

one side of the magnetic steel adjacent to the outer ring rotor is an N pole, and another side of the magnetic steel firmly attached to one of the bar-shaped grooves of the inner ring rotor is an S pole.

The disclosure further includes a piezoelectric sheet fixing structure. One side of the piezoelectric substrate is fixed on the inner peripheral surface of the outer ring of blades through the piezoelectric sheet fixing structure. The fixing structure of the piezoelectric sheet is a bar-shaped block arranged along the axial direction of the outer ring of blades.

The blades of the outer ring of blades and the blades of the inner ring of blades have opposite rotational directions, so that the rotational direction of the outer ring of blades and the rotational direction of the inner ring of blade are opposite to each other under the action of the ocean current.

The disclosure further includes a rotating shaft, a bracket structure and a top fixing part. The inner ring of blades and the outer ring of blades are hinged and arranged through the rotating shaft. The center of the outer ring of blades is provided with a rotating shaft, and the outer circumference of the rotating shaft is coaxially fixedly connected with the inner peripheral surface of the outer ring of blades through a hollowed-out bracket structure. There is a through hole in the center of the inner ring of blades, and the rotating shaft is movably sleeved in the through hole of the inner ring of blades. Both ends of the rotating shaft are provided with the top fixing part, and the top fixing part limit the axial direction of the inner ring of blades in the rotating shaft.

The outer ring of blades is mainly composed of an annular outer housing and a plurality of blades, the inner ends of the plurality of blades are circumferentially arranged at intervals and fixed on the outer peripheral surface of the annular outer housing.

The inner ring of blades is mainly composed of an annular inner housing and a plurality of blades, the outer ends of the plurality of blades are circumferentially arranged at intervals and fixed on the inner peripheral surface of the annular inner housing. Moreover, a hole sleeve is arranged in the center of the annular inner housing, and the inner ends of the plurality of blades are arranged at intervals along the circumference and fixed on the outer circumference of the hole sleeve.

The inner ring rotor adopts resistance-type blades, and the inner ring rotor has better starting performance under the action of microfluidics; the outer ring rotor adopts lift-type blades, and when the flow rate is large, the efficiency of the outer ring rotor is high, and the inner ring rotor and outer ring rotor rotate relative to each other, increasing the relative rotation velocity and thereby increasing the oscillation frequency of the piezoelectric sheet.

The inner ring of blades is 3D printed and formed in one piece.

The magnetic steel is potted with epoxy resin in the magnetic steel groove of the inner ring of rotor.

The number of the blades of the inner ring of blades may be flexibly ranged from 3 to 6 pieces according to the demand, and a drag-type airfoil is adopted.

The number of the outer ring of blades is from 6 to 12 blades, and a lift-type airfoil is adopted.

The piezoelectric sheets are made of PZT-5H material, and the piezoelectric sheets are arranged in 3 rows in the axial direction as a group, and the number of groups of the piezoelectric sheets is flexibly ranged between 6 and 12 according to the demand.

The advantageous effects of the present disclosure:

Compared with other submarine microfluidic devices for utilizing marine energy sources, the present disclosure has the advantages of high energy density, in-situ energy supply, etc., and is able to realize harvesting, storage and utilization of microfluidic energy at an ultra-low microfluidic flow rate, and is of great significance to the long-term power supply of submarine electrical equipment. The present disclosure adopts piezoelectric energy capturing, which avoids the shortcomings of conventional motors including bulky structure and large torque, and increases the starting performance and energy capturing efficiency at low flow rates. The present disclosure adopts the oscillation of the magnetically excited piezoelectric sheet to allow the piezoelectric sheet to have multistability, thereby increasing the oscillation frequency of the piezoelectric sheet, and improving energy capturing efficiency. The present disclosure adopts an inner and outer dual rotor structure, and the resistance-type blades of the inner ring rotor may be launched at low flow rates to oscillate the piezoelectric sheet. The lift-type blades of the outer ring rotor may provide rotation of higher-efficiency at a higher flow rate. The structure of the inner ring rotor and the outer ring rotor expands the capture range of flow rate, and the opposite rotation increases the relative rotational velocity and increases the energy-capturing efficiency of the device.

DESCRIPTION OF THE EMBODIMENTS

The present disclosure will be further described below in conjunction with drawings and embodiments.

Figure 1:
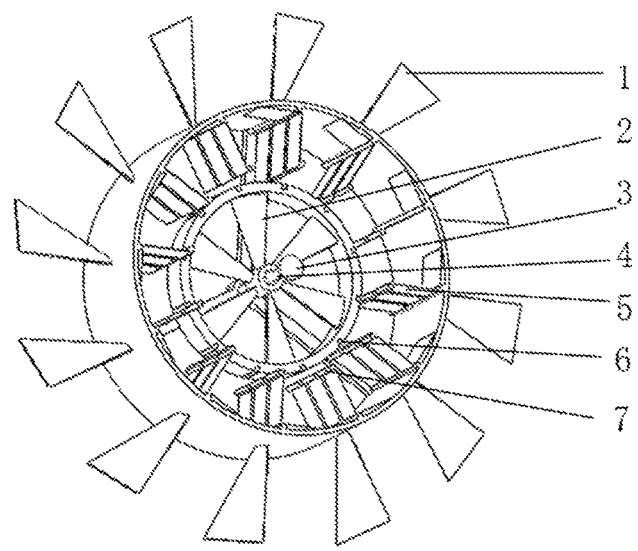
FIG. 1 is an overall design drawing of the present disclosure.

As shown in FIG. 1, a specific implemented device includes an outer ring of blades 1, an inner ring of blades 2, a magnetic piezoelectric component and a magnetic steel 6; the inner ring of blades 2 is movably sleeved in the middle of the outer ring of blades 1, and the inner ring of blades 2 and the outer ring of blades 1 are coaxially arranged and rotate relative to each other. There is an annular gap between the inner ring of blades 2 and the outer ring of blades 1, and a plurality of magnetic piezoelectric components that are sheet-like and a plurality of magnetic steels 6 are disposed in the annular gap. The plurality of magnetic piezoelectric components is arranged at intervals along the circumferential direction of the annular gap, and the sheet-like outer sides of the plurality of magnetic piezoelectric components are fixedly connected to the inner peripheral surface of the outer ring of blades 1 in the form of cantilever beams. The magnetic piezoelectric components and the magnetic steels are magnetically repulsive to each other, and the straight line where each of the sheet-like outer sides of the magnetic piezoelectric components is located is arranged along the axial direction of the inner ring of blades 2 and the outer ring of blades 1. The rotational direction of the blades of the outer ring of blades 1 and the rotational direction of the blades of the inner ring of blades 2 are opposite. The outer ring of blades 1 is mainly composed of an annular outer housing and a plurality of blades. The inner ends of the plurality of blades are circumferentially arranged at intervals and fixed on the outer peripheral surface of the annular outer housing, the number of outer ring of blades 1 is from 6 to 12 blades, and adopts a lift-type airfoil. The inner ring of blades 2 is mainly composed of an annular inner housing and another plurality of blades, and the inner ring of blades 2 is 3D printed and formed in one piece. The outer ends of the another plurality of blades are circumferentially arranged at intervals and fixed on the inner peripheral surface of the annular inner housing, and the center of the annular inner housing is provided with a hole sleeve, and a hole in the hole sleeve is a through hole. The inner ends of the plurality of blades are circumferentially arranged at intervals and fixed on the outer circumference of the hole sleeve. The number of the blades of the inner ring of blades 2 may be flexibly ranged from 3 to 6 pieces according to the demand, and a resistance-type airfoil is adopted. When the inner ring of blades 2 and the outer ring of blades 1 rotate relative to each other, the magnetic piezoelectric components and the magnetic steels 6 are respectively driven to rotate relative to each other, and the inner ends of the magnetic piezoelectric components are driven to oscillate by the change in the movement of the magnetic steels 6 relative to the magnetic piezoelectric components to generate mechanical energy, which is then converted into electrical energy by the piezoelectric effect.

Figure 2:
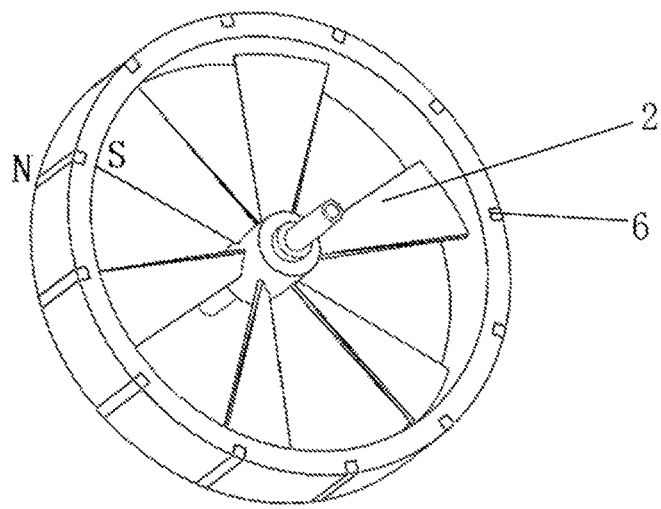
FIG. 2 is a design drawing of an inner ring rotor of the present disclosure.

As shown in FIG. 2, the magnetic steels 6 are bar-shaped blocks arranged along the axial direction of the inner ring of blades 2, and the outer peripheral surface of the inner ring of blades 2 is provided with a plurality of bar-shaped grooves at intervals along the circumferential direction the inner ring of blades 2, and each of the bar-shaped grooves is filled with epoxy resin to pot the corresponding magnetic steel 6.

Figure 3:
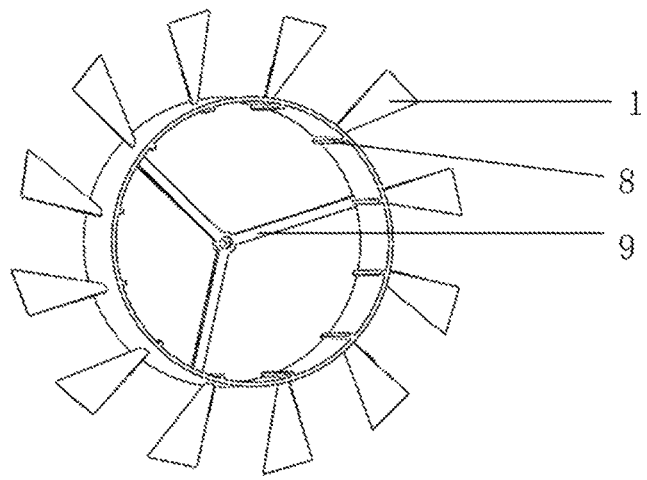
FIG. 3 is a design drawing of an outer ring rotor of the present disclosure.

As shown in FIG. 3, the disclosure further includes piezoelectric sheet fixing structures 8. One side of each of the piezoelectric substrates 10 is fixed on the inner peripheral surface of the outer ring of blades 1 through the corresponding piezoelectric sheet fixing structure 8, and the piezoelectric sheet fixing structure 8 is a bar-shaped block disposed along the outer ring of blades 1 in the axial direction. The piezoelectric sheet fixing structure 8 is provided with a plurality of bolt holes, and one side of the piezoelectric substrate 10 is also provided with a plurality of bolt holes, and the bolt holes of the piezoelectric sheet fixing structure 8 and the bolt holes of the piezoelectric substrate 10 correspond to each other and are connected through bolts to fix one side of the piezoelectric substrate 10 on the inner peripheral surface of the outer ring of blades 1.

Figure 4:
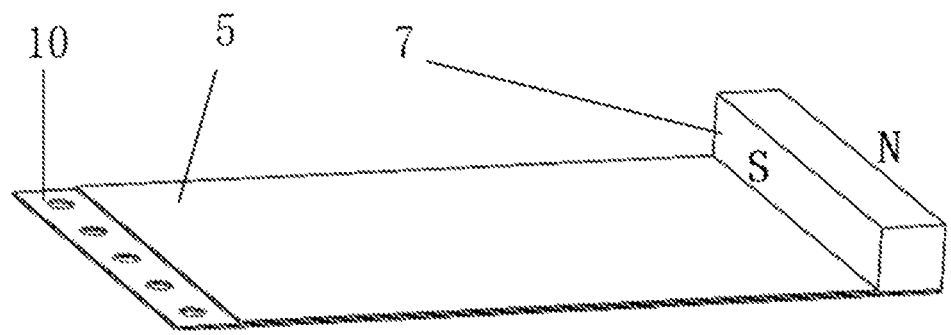
FIG. 4 is a design drawing of a piezoelectric power generation part.

As shown in FIG. 1 and FIG. 4, each of the magnetic piezoelectric components includes a piezoelectric sheet 5, a magnetic steel mass block 7, and a piezoelectric substrate 10; the piezoelectric sheet 5 is arranged on the piezoelectric substrate 10. Each group of the piezoelectric sheets adopts a cantilever beam structure, one side of the piezoelectric substrate 10 is fixed on the inner peripheral surface of the outer ring of blades 1, and the other side of the piezoelectric substrate 10 is fixed with a magnetic steel mass block 7. One end of the cantilever beam of the piezoelectric sheet 5 is fixed with the magnetic steel mass block 7, and the length direction of the magnetic steel mass block 7 is parallel to the other side of the piezoelectric substrate 10. The piezoelectric sheet 5 is made of PZT-5H material, and the piezoelectric sheet 5 are arranged in 3 rows in the axial direction as a group, and the number of groups of the piezoelectric sheets may be flexibly ranged between 6 and 12 according to the demand.

As shown in FIG. 2 and FIG. 4, there is a gap between the magnetic steel mass block 7 and the magnetic steel 6, which are not in contact with each other, and the magnetic steel mass block 7 is used for magnetic repulsion against the magnetic steel 6 fixed on the inner ring of blades 2. One side of the magnetic steel mass block 7 close to the inner ring rotor is the N pole, and another side of the magnetic steel mass block 7 close to the outer ring rotor is the S pole; one side of the magnetic steel 6 close to the outer ring rotor is the N pole, and another side of the magnetic steel 6 firmly attached to one of the bar-shaped grooves of the inner ring rotor is the S pole.

Figure 5:
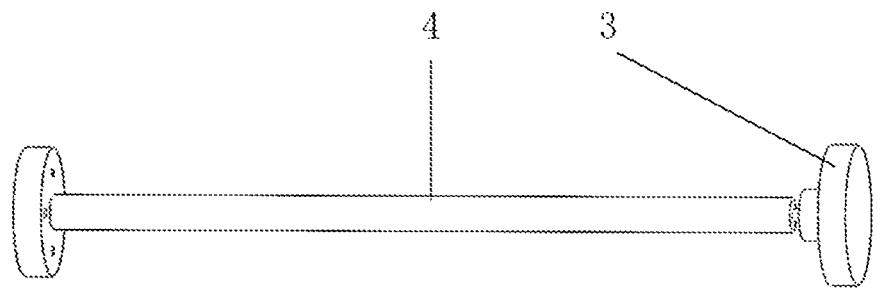
FIG. 5 is a drawing of the connection of a rotating shaft and a top fixing part.

As shown in FIG. 1. FIG. 3 and FIG. 5, the disclosure further includes a rotating shaft 4, a bracket structure 9 and a top fixing part 3, and the inner ring of blades 2 and the outer ring of blades 1 are hingedly arranged through the rotating shaft 4. The center of the outer ring of blades 1 is provided with a rotating shaft 4, and the outer circumference of the rotating shaft 4 is coaxially fixedly connected with the inner peripheral surface of the outer ring of blades 1 through the hollowed-out bracket structure 9, the center of the inner ring of blades 2 is provided with a through hole, and the rotating shaft 4 is movably sleeved in the through hole of the inner ring of blades 2. Both ends of the rotating shaft 4 are provided with the top fixing part 3, and the top fixing part 3 axially limit the inner ring of blades 2 on the rotating shaft 4, so that the inner ring of blades 2 may only rotate on the rotating shaft 4 and is unable to move in the axial direction of the rotating shaft 4. The central fixing shaft is composed of the rotating shaft 4 and the top fixing part 3. The inner ring of blades 2 and the outer ring of blades 1 pass through the rotating shaft 4 and rotate around the rotation shaft 4. The top fixing part 3 is fixed on one end of the shaft to limit the axial movement of the two rotors.

Specific implementation of a work process of the present disclosure is presented as follows:

In the specific implementation, when the ocean tidal current flows, due to the different rotational directions of the inner ring of blades 2 and the outer ring of blades 1, the inner ring of blades 2 and the outer ring of blades 1 are driven to rotate clockwise and counterclockwise respectively. The inner ring of blades 2 and the outer ring of blades 1 rotate relative to each other, and then drive the magnetic piezoelectric component and the magnetic steel 6 to rotate relative to each other.

The magnetic steel mass block 7 in each of the magnetic piezoelectric components and the magnetic steel 6 circumferentially rotate relative to each other. Since the magnetic steel mass block 7 and the magnetic steel 6 have the same direction of polarity arrangement, the magnetic steel mass block 7 in each of the magnetic piezoelectric components is affected by the rotation of the magnetic steel 6 to produce a change in magnetically excited oscillation, causing the piezoelectric sheet 5 connected to the magnetic steel mass block 7 to oscillate.

Finally, due to the piezoelectric principle of the piezoelectric sheet 5, the mechanical energy of the oscillation is converted into electrical energy.

The present disclosure adopts the power generating form of piezoelectric energy capturing, which avoids the disadvantages of bulky structure and large torque of conventional motors, and increases the starting performance and energy capturing efficiency at low flow rates. In the meantime, the oscillation of magnetically exciting piezoelectric sheets is adopted, so that each of the piezoelectric sheets has multistability, which increases the oscillation frequency of the piezoelectric sheets and improves the energy capturing efficiency. The inner and outer dual rotor structure is adopted, and the resistance-type blades of the inner ring rotor may be launched at a low flow rate to oscillate the piezoelectric sheets. The lift-type blades of the outer ring rotor may provide rotation of higher-efficiency at a higher flow rate. The structure of the inner ring rotor and the outer ring rotor expands the capture range of flow rate, and the opposite rotation increases the relative rotational velocity and increases the energy-capturing efficiency of the device.

What is claimed is:

1. A dual-rotor microfluidic energy capturing and power generating device based on a piezoelectric effect, comprising: an outer ring of blades, an inner ring of blades, a plurality of magnetic piezoelectric components and a plurality of magnetic steels; wherein the inner ring of blades is movably sleeved in a middle of the outer ring of blades, the inner ring of blades and the outer ring of blades are coaxially arranged and rotate relative to each other, an annular gap exists between the inner ring of blades and the outer ring of blades, the plurality of magnetic piezoelectric components that are sheet-like and the plurality of magnetic steels are disposed in the annular gap, the plurality of magnetic piezoelectric components are arranged at intervals along a circumferential direction of the annular gap, sheet-like outer sides of the plurality of magnetic piezoelectric components are fixedly connected to an inner peripheral surface of the outer ring of blades in a form of cantilever beams, the plurality of magnetic steels are circumferentially uniformly distributed and fixed on an outer peripheral surface of the inner ring of blades, the plurality of magnetic piezoelectric components and the plurality of magnetic steels are magnetically repulsive to each other, and straight lines where the sheet-like outer sides of the plurality of magnetic piezoelectric components are located are arranged along an axial direction of the inner ring of blades and the outer ring of blades; the inner ring of blades and the outer ring of blades rotate relative to each other and meanwhile respectively drive the plurality of magnetic piezoelectric components and the plurality of magnetic steels to rotate relative to each other, and an inner end of each of the plurality of magnetic piezoelectric components is driven to oscillate by a change in movement of the plurality of magnetic steels relative to the plurality of magnetic piezoelectric components to generate a mechanical energy, which is then converted into an electrical energy by the piezoelectric effect.

2. The dual-rotor microfluidic energy capturing and power generating device based on the piezoelectric effect according to claim 1, wherein each of the plurality of magnetic piezoelectric components comprises a piezoelectric sheet, a magnetic steel mass block, and a piezoelectric substrate; the piezoelectric sheet is arranged on the piezoelectric substrate, one side of the piezoelectric substrate is fixed on the inner peripheral surface of the outer ring of blade, and another side of the piezoelectric substrate is fixed with the magnetic steel mass block, a length direction of the magnetic steel mass block is parallel to the another side of the piezoelectric substrate, and the magnetic steel mass block is provided to magnetically repulsive against the plurality of magnetic steels fixed on the inner ring of blades.

3. The dual-rotor microfluidic energy capturing and power generating device based on the piezoelectric effect according to claim 1, wherein the outer peripheral surface of the inner ring of blades is circumferentially provided with a plurality of bar-shaped grooves at intervals, and each of the bar-shaped grooves is arranged along the axial direction of the inner ring of blades and is provided with one of the plurality of magnetic steels.

4. The dual-rotor microfluidic energy capturing and power generating device based on the piezoelectric effect according to claim 2, wherein a gap exists between the magnetic steel mass block and the plurality of magnetic steels, and the magnetic steel mass block is not in contact with the plurality of magnetic steels.

5. The dual-rotor microfluidic energy capturing and power generating device based on the piezoelectric effect according to claim 2, wherein one side of the magnetic steel mass block adjacent to an inner ring rotor is an N pole, another side of the magnetic steel mass block adjacent to an outer ring rotor is an S pole; one side of each of the plurality of magnetic steels adjacent to the outer ring rotor is an N pole, and another side of each of the plurality of magnetic steels firmly attached to a bar-shaped groove of the inner ring rotor is an S pole.

6. The dual-rotor microfluidic energy capturing and power generating device based on the piezoelectric effect according to claim 2, further comprising a piezoelectric sheet fixing structure, wherein the one side of the piezoelectric substrate is fixed on the inner peripheral surface of the outer ring of blades through the piezoelectric sheet fixing structure, and the piezoelectric sheet fixing structure is a bar-shaped block disposed along an axial direction of the outer ring of blades.

7. The dual-rotor microfluidic energy capturing and power generating device based on the piezoelectric effect according to claim 1, wherein blades of the outer ring of blades and blades of the inner ring of blades have opposite rotational directions, so that a rotational direction of the outer ring of blades and a rotational direction of the inner ring of blades are opposite to each other under an action of an ocean current.

8. The dual-rotor microfluidic energy capturing and power generating device based on the piezoelectric effect according to claim 1, further comprising a rotating shaft, a bracket structure and a top fixing part, wherein the inner ring of blades and the outer ring of blades are hingedly arranged through the rotating shaft; a center of the outer ring of blades is provided with the rotating shaft, an outer circumference of the rotating shaft is coaxially fixedly connected with the inner peripheral surface of the outer ring of blades through the bracket structure that are hollowed-out, a center of the inner ring of blades is provided with a through hole, the rotating shaft is movably sleeved in the through hole of the inner ring of blades, both ends of the rotating shaft are provided with the top fixing part, and the top fixing part axially limits the inner ring of blades on the rotating shaft.

9. The dual-rotor microfluidic energy capturing and power generating device based on the piezoelectric effect according to claim 1, wherein the outer ring of blades is mainly composed of an annular outer housing and a plurality of blades, and inner ends of the plurality of blades are circumferentially arranged at intervals and fixed on an outer peripheral surface of the annular outer housing.

10. The dual-rotor microfluidic energy capturing and power generating device based on the piezoelectric effect according to claim 1, wherein the inner ring of blades is mainly composed of an annular inner housing and a plurality of blades, outer ends of the plurality of blades are circumferentially arranged at intervals and fixed on an inner peripheral surface of the annular inner housing, and a hole sleeve is arranged in a center of the annular inner housing, and inner ends of the plurality of blades are circumferentially arranged at intervals and fixed on an outer circumference of the hole sleeve.

\* \* \* \* \*